United States Patent
Koike et al.

(10) Patent No.: US 10,397,579 B2
(45) Date of Patent: Aug. 27, 2019

(54) SAMPLING RATE CONVERTER

(71) Applicant: NTT Electronics Corporation, Yokohama-shi, Kanagawa (JP)

(72) Inventors: Yuichiro Koike, Kanagawa (JP); Yasuhiro Yamada, Kanagawa (JP)

(73) Assignee: NTT ELECTRONICS CORPORATION, Yokohama (JP)

( * ) Notice: Subject to any disclaimer, the term of this patent is extended or adjusted under 35 U.S.C. 154(b) by 294 days.

(21) Appl. No.: 14/439,836

(22) PCT Filed: May 9, 2013

(86) PCT No.: PCT/JP2013/063007
§ 371 (c)(1),
(2) Date: Apr. 30, 2015

(87) PCT Pub. No.: WO2014/080649
PCT Pub. Date: May 30, 2014

(65) Prior Publication Data
US 2015/0304660 A1    Oct. 22, 2015

(30) Foreign Application Priority Data

Nov. 22, 2012 (JP) .................................. 2012-256368

(51) Int. Cl.
*H04N 19/00* (2014.01)
*H04N 19/132* (2014.01)
(Continued)

(52) U.S. Cl.
CPC ...... *H04N 19/132* (2014.11); *H03H 17/0621* (2013.01); *H03H 17/0642* (2013.01);
(Continued)

(58) Field of Classification Search
CPC ........................... H03H 17/06; H03H 17/0628
See application file for complete search history.

(56) References Cited

U.S. PATENT DOCUMENTS

| 4,748,578 A | 5/1988 | Lagadec et al. |
| 4,953,117 A | 8/1990 | Lagadec |
| (Continued) | | |

FOREIGN PATENT DOCUMENTS

| JP | 04-072905 A | 3/1992 |
| JP | 04-235407 A | 8/1992 |
| (Continued) | | |

OTHER PUBLICATIONS

International Search Report and Written Opinion of PCT/JP2013/063007 dated Aug. 13, 2013.
(Continued)

*Primary Examiner* — Frank F Huang
(74) *Attorney, Agent, or Firm* — Arent Fox LLP

(57) ABSTRACT

A position coordinate difference computing unit (5a to 5c) calculates position coordinate differences between position coordinates of the output digital signals and position coordinates of the input digital signals adjacent to the position coordinates. An FIR coefficient memory (13a to 13c) stores FIR coefficients of an FIR-LPF and outputs FIR coefficients corresponding to position coordinate differences between a fixed number of the output digital signals adjacent to the position coordinates of the output digital signals and the output digital signals. A control unit (11) supplies a group of the FIR coefficients and a group of the input digital signals corresponding to the respective position coordinate differences to the parallel FIR calculator (4) in predetermined order when the position coordinate differences corresponding to two or more different output digital signals are concurrently computed. The parallel FIR calculator (4) performs an FIR-LPF interpolating calculation by using those to obtain the output digital signals.

3 Claims, 11 Drawing Sheets

(51) Int. Cl.
*H03H 17/06* (2006.01)
*H04N 19/117* (2014.01)
*H04N 19/167* (2014.01)
*H04N 19/182* (2014.01)
*H04N 19/436* (2014.01)
*H04N 19/164* (2014.01)

(52) U.S. Cl.
CPC ......... *H04N 19/117* (2014.11); *H04N 19/164* (2014.11); *H04N 19/167* (2014.11); *H04N 19/182* (2014.11); *H04N 19/436* (2014.11)

(56) References Cited

U.S. PATENT DOCUMENTS

| | | |
|---|---|---|
| 5,719,571 A | 2/1998 | Akune et al. |
| 2003/0065463 A1 | 4/2003 | Lenez et al. |
| 2012/0269238 A1* | 10/2012 | Fujimura ........... H03H 17/0266 375/211 |

FOREIGN PATENT DOCUMENTS

| | | |
|---|---|---|
| JP | 08-065105 A | 3/1996 |
| JP | 08-084048 A | 3/1996 |
| JP | 09-148885 A | 6/1997 |

OTHER PUBLICATIONS

International Preliminary Report dated Jun. 4, 2015; Application No. PCT/JP2013/063007.
Extended European Search Report of related European Patent Application No. 13856624.5 dated Jul. 21, 2016.

* cited by examiner

SAMPLING RATE CONVERTER

CROSS-REFERENCE TO RELATED APPLICATION

This application is a National Stage entry of International Application No. PCT/JP2013/063007, filed May 9, 2013, which claims priority to Japanese Patent Application No. 2012-256368, filed Nov. 22, 2012. The disclosures of the priority applications are incorporated in their entirety herein by reference.

TECHNICAL FIELD

The present invention relates to a sampling rate converter used for a digital frame size converter, digital audio and the like.

BACKGROUND ART

Sampling rate converters are used for converting input digital signals sampled at an input sampling rate into output digital signals sampled at an output sampling rate. In a conventional sampling rate converter, with a ratio between an input sampling rate R1 and an output sampling rate R2 being R1:R2=A·M:A·N=M:N (wherein A is a constant and M and N are relatively prime positive integers), the input sampling rate R1 is first converted into a sampling rate R3 that is the least common multiple of the output sampling rate R2, i.e., R3=R1·N=R2·M (upsampling). Next, samples in conformity with the output sampling rate R2 are extracted (downsampled) from a sequence of sample values which are N times larger than the input digital signals to obtain the output digital signals.

FIG. 10 is an explanatory view of a conventional method for converting sampling rates. Circles in FIG. 10 represent digital signals at the sampling rate R3. Among these circles, shaded circles represent input digital signals at the input sampling rate R1, circles of a thick line represent output digital signals at the output sampling rate R2, and white circles of a thin line represent signals other than the input/output digital signals.

The digital signals at the sampling rate R3 are calculated based on the input digital signals (upsampling). In upsampling, interpolation values are computed by using a finite impulse response low pass filter (FIR-LPF) which has a characteristic of blocking frequency components which are ½ or more of the output sampling rate R2. Then, out of the digital signals at the sampling rate R3, output digital signals at the output sampling rate R2 are extracted (downsampling).

Here, reduction in the sampling rate is referred to as downsampling. In the case of downsampling, the FIR-LPF is used to block high-frequency components of input signals and to suppress loopback noise caused by the reduction in the sampling rate. Contrary to this, increase in the sampling rate is referred to as upsampling. In the case of upsampling, it is not necessary to block the high-frequency components of input signals, but the FIR-LPF is used to compute interpolation values interpolated into positions different from the input digital signals.

FIG. 11 illustrates an impulse response of the FIR-LPF. The impulse response of the filter is expressed by the time function of a specified filter characteristics subjected to inverse Fourier transformation. When an impulse is input at time 0, an impulse response waveform is present around the time 0. In computation of interpolation values, an output digital signal at the time 0 is computed by using input digital signals in the range where the impulse response waveform is present. Although the impulse response waveform generally continues for a long time, the impulse response waveform is cut into a finite length of a fixed degree in consideration of practicality, and signal processing is performed therein.

In an actual converter, the time (negative time) to start an impulse response is set to 0 or a positive number. Specifically, start time−T of the impulse response is converted into 0, and the original time 0 is set to T for execution of sampling rate conversion. In digital signal processing, using a memory (shift register) enables such time shift processing.

CITATION LIST

Patent Literature

Patent Literature 1: Japanese Patent Laid-Open No. 8-84048

SUMMARY OF INVENTION

Technical Problem

Conventionally, a high sampling rate R3 is created to generate samples which include both the samples obtained at the sampling rates R1 and R2, and a sequence of samples at the sampling rate R2 are extracted from the samples generated at the sampling rate R3. For example, when R1=15 MHz and R2=16 MHz, the sampling rate R3 at which both the samples are generated is equal to R3=15×16 MHz=240 MHz. It is difficult to implement a converter having such a very high sampling rate R3 by an inexpensive semiconductor technology. It is also difficult to design a complicated digital circuit that provides three operation clock frequencies corresponding to the three sampling rates R1, R2, and R3. There is also a demand for a versatile sampling rate converter which can support arbitrary input/output sampling rates (i.e., rates wherein M and N are arbitrary).

In order to avoid use of the high sampling rate R3, it is proposed to mount a plurality of FIR calculation units operative at two sampling rates R1 and R2 in parallel (see, for example, Patent Literature 1). However, mounting a plurality of FIR calculation units in parallel causes a problem of considerable increase in circuit size.

Moreover, recent spread of video and audio service via networks generates a demand for parallel conversion to a plurality of sampling rates so as to dynamically support change in network quality. Specifically, in video data, frame size conversion is performed as sampling rate conversion. In compression encoding, such as MPEG (Moving Picture Experts Group) encoding, the sampling rate is substantially proportional to the number of pixels. For example, a plurality of conversion rates of $1/\sqrt{2}$ (7/10 in actuality to have a rational ratio), 1/2, $1/2\sqrt{2}$, 1/4, . . . are prepared both in vertical and horizontal directions. As a consequence, sampling rates of 1/2, 1/4, 1/8, . . . with respect to an original image can be prepared in a wide range. This makes it possible to continuously provide the service without interruption even when change in network quality (change in available sampling rate) occurs.

However, since there is no known method for efficiently obtain an output at a plurality of different sampling rates from one input, a plurality of conventional apparatuses are used in unison. Accordingly, a plurality of parallel FIR calculators extremely large in circuit size are needed, which leads to further increase in circuit size, and thereby causes a problem of an increased cost.

The present invention has been made in order to solve the above-stated problems, and an object of the present invention is to provide an inexpensive and versatile sampling rate converter which is small in circuit size and is capable of performing parallel conversion to a plurality of sampling rates.

Means for Solving the Problems

A sampling rate converter according to the present invention converting input digital signals sampled at an input sampling rate into a plurality (a) of output digital signals Yki (i=1, 2, . . . , a) each sampled at output sampling rates different from each other, includes: a position coordinate difference computing unit calculating position coordinate differences Did between position coordinates Tki of the plurality of output digital signals Yki and position coordinates of the input digital signals adjacent to the position coordinates Tki; an FIR coefficient memory storing FIR coefficients F(z) of a finite impulse response low pass filter (FIR-LPF) having a characteristic of blocking frequency components which are ½ or more of the output sampling rate, wherein an impulse input is input into the FIR-LPF and a position coordinate of the impulse input is set to z=0, and outputting FIR coefficients F (Tki−Zki (q)) corresponding to position coordinate differences (Tki−Zki (q)) (q=1, 2, . . . , p) when the position coordinate differences Did are input, wherein Zki (q) represent position coordinates of a fixed number (p) of input digital signals Xki (q) present in the vicinity of a periphery of the position coordinates Tki of the output digital signals Yki; an FIR calculator calculating Yki=F(Tki−Zki(1))*Xki(1)+F(Tki−Zki(2))*Xki(2)+ . . . +F(Tki−Zki(p))*Xki (p) to obtain the plurality of output digital signals Yki; and a control unit supplying a group of the FIR coefficients and a group of the input digital signals corresponding to the respective position coordinate differences, to the FIR calculator in predetermined order when the position coordinate differences corresponding to two or more different output digital signals are concurrently computed.

Advantageous Effects of Invention

The present invention makes it possible to provide an inexpensive and versatile sampling rate converter which is small in circuit size and is capable of performing parallel conversion to a plurality of sampling rates.

DESCRIPTION OF EMBODIMENTS

A sampling rate converter according to the embodiments of the present invention will be described with reference to the drawings. The same components will be denoted by the same symbols, and the repeated description thereof may be omitted.

First Embodiment

Figure 1:
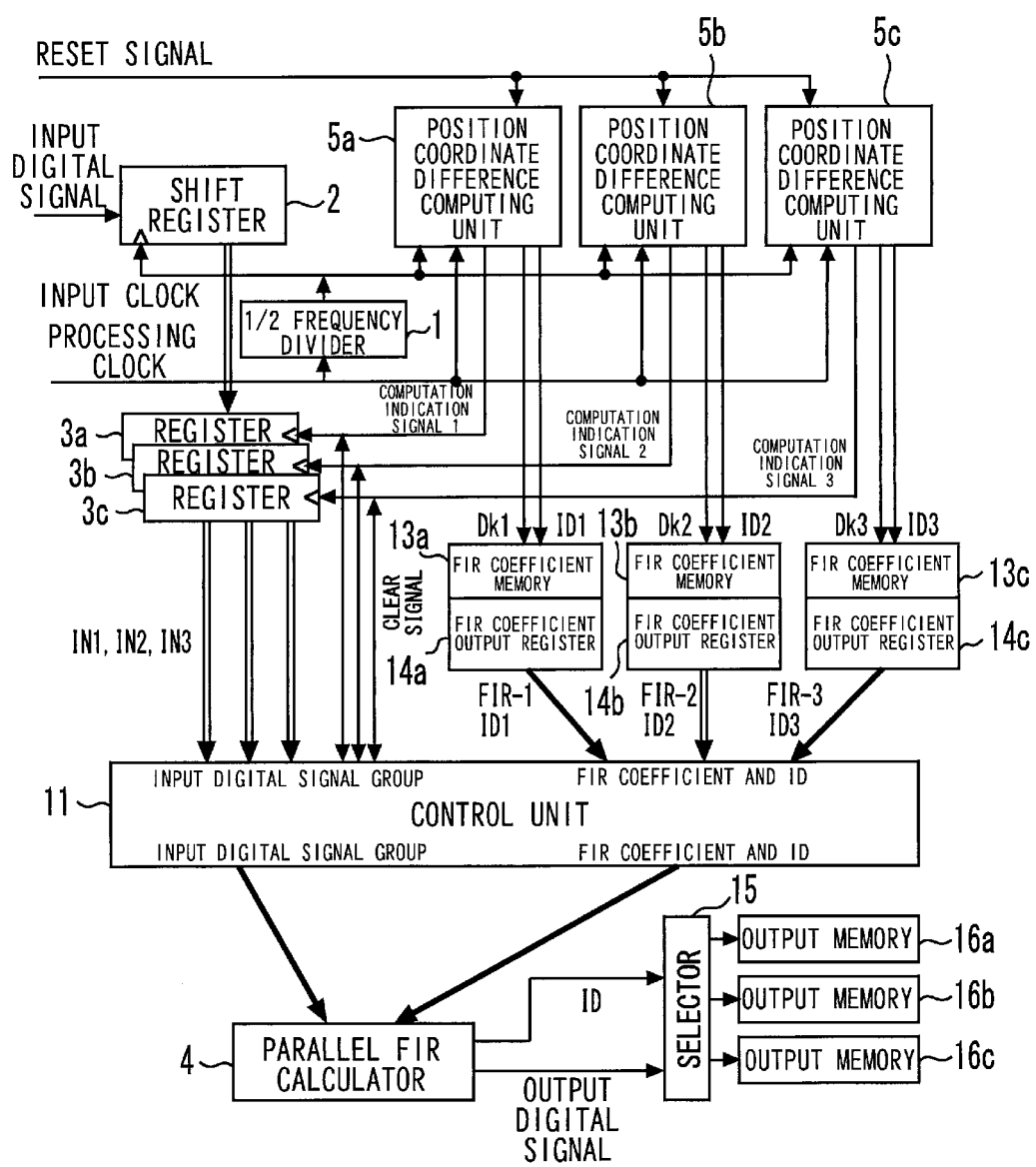
FIG. 1 is a block diagram illustrating a sampling rate converter according to a first embodiment of the present invention.

FIG. 1 is a block diagram illustrating a sampling rate converter according to a first embodiment of the present invention. This converter converts input digital signals sampled at an input sampling rate into a plurality (a) of output digital signals Yki (i=1, 2, . . . , a) each sampled at output sampling rates different from each other. In the present embodiment, conversion into three output digital signals Yk1 to Yk3 is performed (i.e., a=3).

A frequency divider 1 divides a processing clock to generate an input clock. The frequency of an input clock is half the frequency of the processing clock. A shift register 2 sequentially inputs input digital signals in synchronization with the input clock, stores a group of a specified number of (p) input digital signals, and parallelly outputs the signal group. A plurality of registers 3a to 3c primarily stores a group of input digital signals input in parallel from the shift register 2. A parallel FIR calculator 4 converts a group of input digital signals IN1, IN2, and IN3 supplied from one of the register 3a to 3c into output digital signals.

Position coordinate difference computing units 5a to 5c each calculate a position coordinate difference Dki between a position coordinate Tki of a k-th output digital signal Yki (i=1, 2, 3) and a position coordinate of each input digital signal adjacent to the position coordinate Tki. Herein, "input digital signal adjacent to the position coordinate Tki" is any one of (1) input digital signals whose position coordinate difference with the position coordinate Tki is equal to 0 or a positive value closest to 0, (2) an input digital signal whose position coordinate difference with the position coordinate Tki is equal to 0 or a negative value closest to 0, and (3) an input digital signal whose position coordinate is closest to the position coordinate Tki as a result of evaluating an absolute value of the position coordinate difference with the position coordinate Tki. A target input digital signal may be deviated by one input sample cycle depending on which criterion to adopt.

Figure 2:
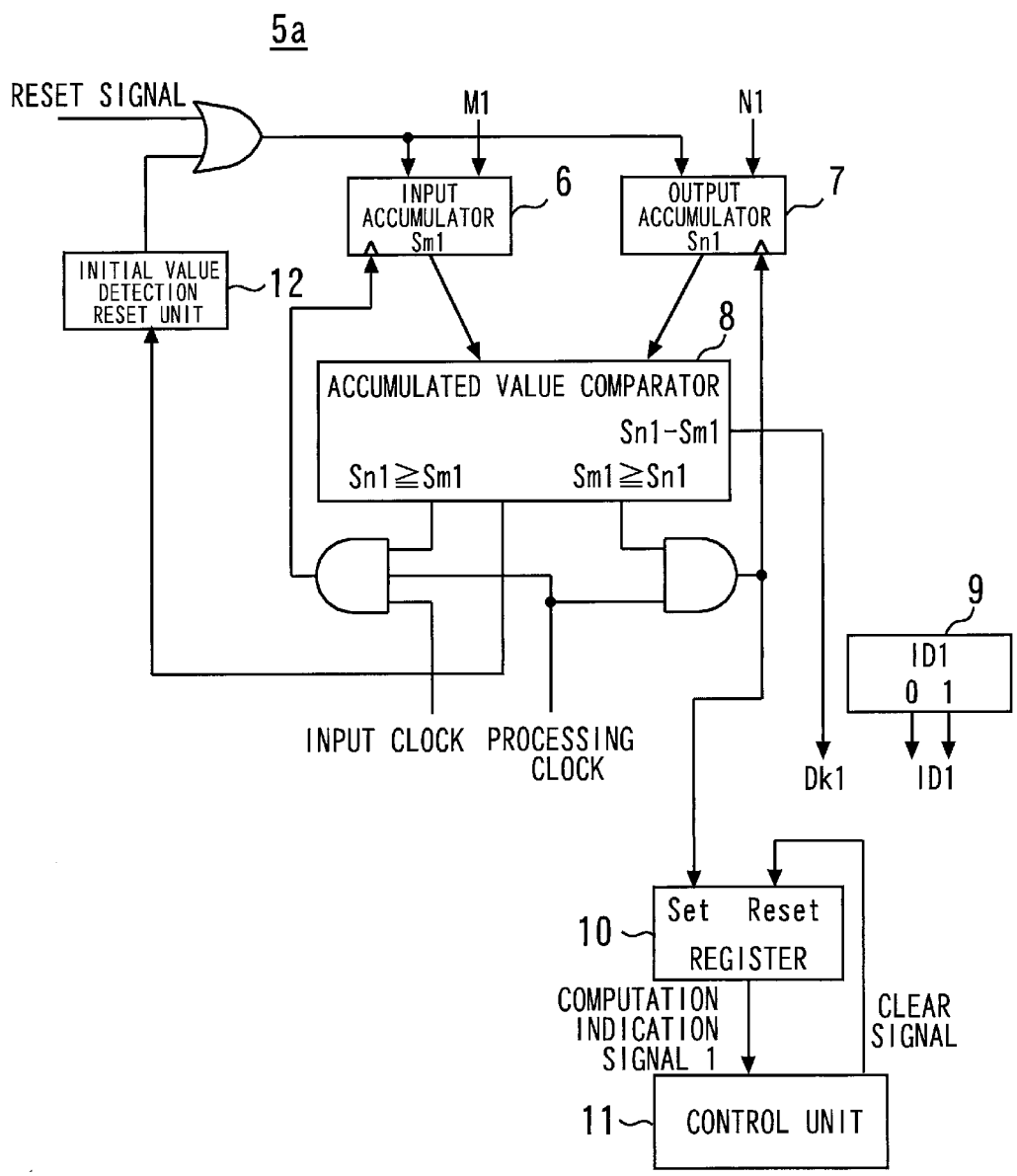
FIG. 2 is a block diagram illustrating the position coordinate difference computing unit according to the first embodiment of the present invention.

FIG. 2 is a block diagram illustrating the position coordinate difference computing unit according to the first embodiment of the present invention. The position coordinate difference computing unit 5a has an input accumulator 6, an output accumulator 7, a accumulated value comparator 8 that controls the input accumulators, and an ID generation unit 9. The position coordinate difference computing units 5b and 5c also have a similar configuration.

When C1 represents a constant, and M1 and N1 are relatively prime positive integers, a sampling period of an input digital signal is set to C1·M1, and a sampling period of an output digital signal is set to C1·N1. The input accumulator 6 accumulates M1 and outputs an accumulated value Sm1. The output accumulator 7 accumulates N1 and outputs an accumulated value Sn1. If Sm1 Sn1, the accumulated value comparator 8 makes the input accumulator 6 accumulate M1. If Sn1≤Sm1, the accumulated value comparator 8 makes the output accumulator 7 accumulate N1, and outputs Sn1−Sm1 as a position coordinate difference Dk1 obtained when the output accumulator 7 is made to accumulate N1. At this point, the ID generation unit 9 outputs an ID 1.

If Sn1≤Sm1, a computation indication signal 1 is output. The computation indication signal 1 is maintained and stored in a register 10 and is sent to a control unit 11 and a register 3a. The register 3a stores a group of input digital signals at the time when the computation indication signal 1 is received. Then, after receiving the computation indication signal 1, the control unit 11 returns a clear signal to the register 10, and clears the computation indication signal 1. Since the computation indication signal maintains the same state for several processing clock periods, computation corresponding to the computation indication signal from each of the position coordinate difference computing units 5a to 5c can also be performed during this period.

As Sm1 and Sn1 become larger, the number of bits of the device, such as a register, an adder-subtractor, and a size determiner, which hold Sm1 and Sn1 in the position coordinate difference computing unit 5a, is increased. In order to prevent the increase, an initial value detection reset unit 12 resets Sm1 and Sn1 to an initial value when a difference between Sm1 and Sn1 is matched with the initial value. When a reset signal is input from the outside, Sm1 and Sn1 are also reset to the initial value.

A ratio of conversion from an input sampling rate to an output sampling rate by the three position coordinate difference computing units 5a to 5c is set to 7/10, 1/2, and 7/20 which are rational ratios close to $1/\sqrt{2}$, 1/2, and $1/2\sqrt{2}$. A ratio between input and output cycles are set to M1=7, N1=10, M2=1, N2=2, M3=7, and N3=20 which are each relatively prime positive integers close to $\sqrt{2}$, 2, and $2\sqrt{2}$.

FIR coefficient memories 13a to 13c are each a random access memory (RAM) or a read only memory (ROM) which stores FIR coefficients F(z) of a finite impulse response low pass filter (FIR-LPF) having a characteristic of blocking frequency components which are ½ or more of the output sampling rate, when the position coordinate of an impulse input, which is input into the FIR-LPF, is set to z=0. When position coordinate differences Dki=Sni−Smi (i=1, 2, 3) are input from the position coordinate difference computing units 5a to 5c, the FIR coefficient memories 13a to 13c output FIR coefficients F (Tki−Zki (q)) corresponding to the position coordinate differences (Tki−Zki(q)) (q=1, 2, . . . , p), wherein Zki (q) represent position coordinates of a fixed number (p) of input digital signals Xki (q) present in the vicinity of a periphery of the position coordinate Tki of the output digital signal Yki.

Accordingly, the FIR coefficient memories 13a to 13c store a set of FIR coefficients for each type of the position coordinate difference Did, and select and output a set of FIR coefficients in accordance with the input position coordinate difference Did. During a period of a least common multiple Mi·Ni between an input cycle Mi and an output cycle Ni, the output cycle Ni is repeated Mi times. Accordingly, there are Mi types of the position coordinate difference Did, and therefore Mi sets of FIR coefficients are necessary. The FIR coefficient memories 13a to 13c are not individual elements, but are typically made of one RAM divided by addresses to use.

When input digital signals are supplied from the shift register 2 and FIR coefficients are supplied from the FIR coefficient memories 13a to 13c, the parallel FIR calculator 4 calculates Yki=F(Tki−Zki(1))*Xki(1)+F(Tki−Zki(2)) *Xki(2)+ . . . +F(Tki−Zki(p))*Xki (p) to obtain output digital signals Yki (FIR-LPF interpolating calculation). For example, the parallel FIR calculator 4 is an 8-tap parallel FIR calculator which performs parallel multiply and accumulation of eight input digital signals to obtain one output digital signal.

However, when a computation indication signal is generated, a group of input digital signals, a group of FIR coefficients, and identification codes ID necessary for computing the output digital signals are temporarily stored in registers. That is, the FIR coefficients and the identification codes ID1 to ID3 output from the FIR coefficient memories 13a to 13c are each temporarily stored in the FIR coefficient output registers 14a to 14c, while the registers 3a to 3c store a group of input digital signals at the time when the computation indication signal is received. The control unit 11 reads them in sequence, and supplies them to the parallel FIR calculator 4.

The control unit 11 is a parallel serial converter (priority-Encoder). When position coordinate differences each corresponding to two or more different output digital signals are concurrently computed, the control unit 11 supplies the group of FIR coefficients and the group of input digital signals corresponding to the respective position coordinate differences, to the parallel FIR calculator 4 in predetermined order. Here, when the three position coordinate difference computing units 5a to 5c concurrently compute position coordinate differences, a signal of the position coordinate difference computing unit 5 is processed first, a signal of the position coordinate difference computing unit 5b is processed second, and a signal of the position coordinate difference computing unit 5c is processed third.

The output digital signals calculated by the parallel FIR calculator 4 are temporarily stored in output memories 16a to 16c corresponding to the IDs by a selector 15 before being output in synchronization with an output clock.

Figure 3:
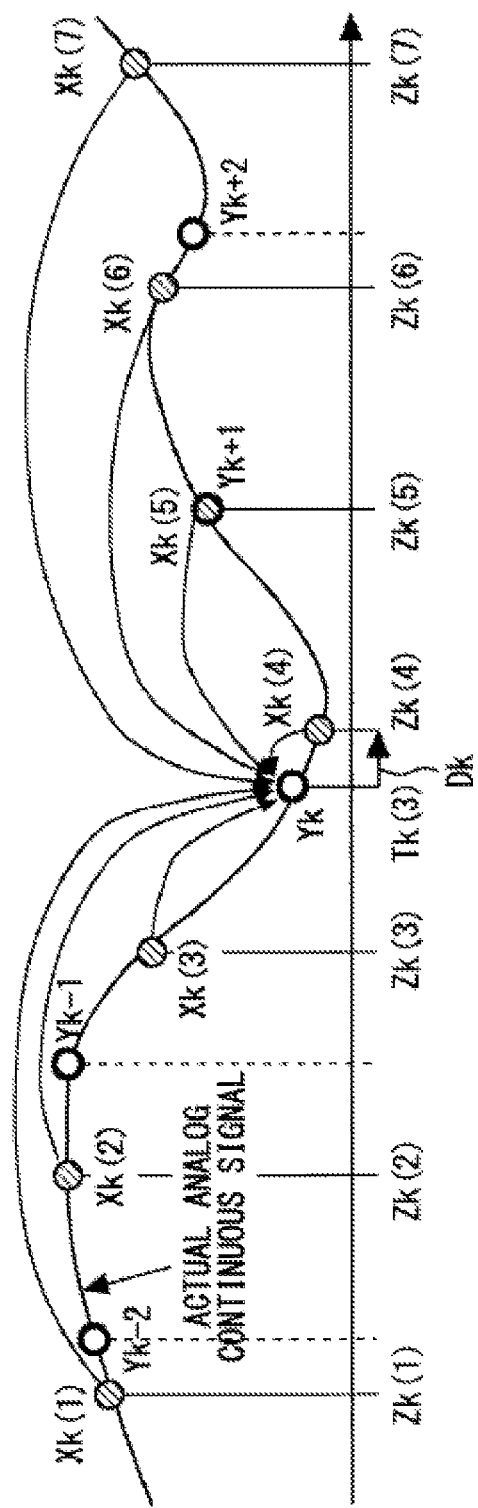
FIG. 3 is a simple explanatory view of the principle of FIR-LPF interpolating calculation.

FIG. 3 is a simple explanatory view of the principle of FIR-LPF interpolating calculation. In FIG. 3, shaded circles represent input digital signals and circles of a thick line represent an output digital signal. An input cycle M is 4 and an output cycle N is 5. An output digital signal Yk present at a position Tk which is not present in the input digital signals is computed through interpolation based on the input digital signals Xk (q) around the position Tk. Although the impulse response waveform of a filter generally continues for a long time, the impulse response waveform is cut into a finite length of a fixed degree in consideration of practicality, and signal processing is performed therein. In the case of video signals, about thirty input digital signals around the output digital signal Yk (fifteen signals before and after the output digital signal Yk) are used. In the case of audio signals, high accuracy is required, so that about fifty to one hundred input digital signals around the signal Yk are used. The accuracy of interpolating calculation is higher as a larger number of input digital signals are used. In this case, a 7-tap FIR-LPF which computes an output digital signal from seven input digital signals is used. Since an input digital signal adjacent to the signal Yk is Xk(4), Yk is calculated by using seven input digital signals Xk(1) to Xk(7) adjacent to Yk. Since an input digital signal adjacent to Yk+1 is Xk(5) (their positions are matched), Yk+1 is calculated by using input digital signals Xk(2) to Xk(8) adjacent to Yk+1. It is to be noted that Xk(2) to Xk(8) can also be expressed as Xk+1(1) to Xk+1(7).

Figure 4:
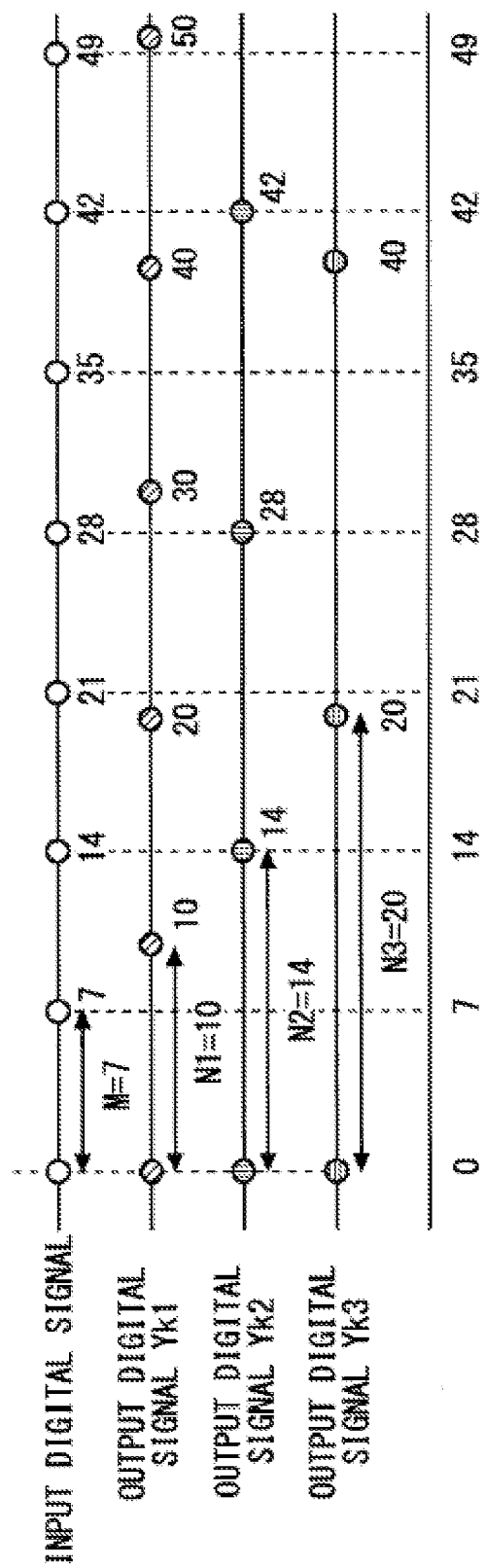
FIG. 4 illustrates the position of input/output digital signals.

FIG. 4 illustrates the position of input/output digital signals. Circles represent the positions of input/output digital signals, and their first positions in both the input and output signals are set to 0. The positions of the input digital signals are shifted by the cycle of M1 to M7=7 in unit of 1. The position of an output digital signal Yk1 is shifted by the cycle of N1=10. The position of an output digital signal Yk2 is shifted by the cycle of N2=14. The position of an output digital signal Yk3 is shifted by the cycle of N3=20.

Transition of the accumulated value in the present embodiment is illustrated in Table 1, wherein M1=7, N1=10, M2=1, N2=2, M3=7, and N3=20. An item "Mod7 phase difference" in Table 1 represents modulo (Sni−Smi, 7), which indicates a remainder (0 to 6) of Sni−Smi divided by 7.

TABLE 1

| processing clock | M1 accumulation | Sm1 | N1 accumulation | Sn1 | Mod7 phase difference 1 | Reset | M2 accumulation | Sm2 | N2 accumulation | Sn2 | Mod7 phase difference 2 | Reset | M3 accumulation | Sm3 | N3 accumulation | Sn3 | Mod7 phase difference 3 | Reset | output computation |
|---|---|---|---|---|---|---|---|---|---|---|---|---|---|---|---|---|---|---|---|
|  |  | 0 |  | 0 | 0 | 1 |  | 0 |  | 0 | 0 | 1 |  | 0 |  | 0 | 0 | 1 |  |
| 1 | 1 | 7 | 1 | 10 | 3 | 0 | 1 | 1 | 1 | 2 | 1 | 0 | 1 | 7 | 1 | 20 | 6 | 0 | computing unit 1 |
| 2 | 0 | 7 | 0 | 10 | 3 | 0 | 0 | 1 | 0 | 2 | 1 | 0 | 0 | 7 | 0 | 20 | 6 | 0 | computing unit 2 |
| 3 | 1 | 14 | 0 | 10 | 3 | 0 | 1 | 2 | 0 | 2 | 0 | 1 | 1 | 14 | 0 | 20 | 6 | 0 | computing unit 3 |
| 4 | 0 | 14 | 1 | 20 | 6 | 0 | 0 | 0 | 1 | 2 | 2 | 0 | 0 | 14 | 0 | 20 | 6 | 0 | computing unit 1 |
| 5 | 1 | 21 | 0 | 20 | 6 | 0 | 1 | 1 | 0 | 2 | 1 | 0 | 1 | 21 | 0 | 20 | 6 | 0 | computing unit 2 |
| 6 | 0 | 21 | 1 | 30 | 2 | 0 | 0 | 1 | 0 | 2 | 1 | 0 | 0 | 21 | 1 | 40 | 5 | 0 | computing unit 1 |
| 7 | 1 | 28 | 0 | 30 | 2 | 0 | 1 | 2 | 0 | 2 | 0 | 1 | 1 | 28 | 0 | 40 | 5 | 0 | computing unit 3 |
| 8 | 0 | 28 | 0 | 30 | 2 | 0 | 0 | 0 | 1 | 2 | 2 | 0 | 0 | 28 | 0 | 40 | 5 | 0 | computing unit 2 |
| 9 | 1 | 35 | 0 | 30 | 2 | 0 | 1 | 1 | 0 | 2 | 1 | 0 | 1 | 35 | 0 | 40 | 5 | 0 | — |
| 10 | 0 | 35 | 1 | 40 | 5 | 0 | 0 | 1 | 0 | 2 | 1 | 0 | 0 | 35 | 0 | 40 | 5 | 0 | computing unit 1 |
| 11 | 1 | 42 | 0 | 40 | 5 | 0 | 1 | 2 | 0 | 2 | 0 | 1 | 1 | 42 | 0 | 40 | 5 | 0 | — |
| 12 | 0 | 42 | 1 | 50 | 1 | 0 | 0 | 0 | 1 | 2 | 2 | 0 | 0 | 42 | 1 | 60 | 4 | 0 | computing unit 1 |
| 13 | 1 | 49 | 0 | 50 | 1 | 0 | 1 | 1 | 0 | 2 | 1 | 0 | 1 | 49 | 0 | 60 | 4 | 0 | computing unit 2 |
| 14 | 0 | 49 | 0 | 50 | 1 | 0 | 0 | 1 | 0 | 2 | 1 | 0 | 0 | 49 | 0 | 60 | 4 | 0 | computing unit 3 |
| 15 | 1 | 56 | 0 | 50 | 1 | 0 | 1 | 2 | 0 | 2 | 0 | 1 | 1 | 56 | 0 | 60 | 4 | 0 | — |
| 16 | 0 | 56 | 1 | 60 | 4 | 0 | 0 | 0 | 1 | 2 | 2 | 0 | 0 | 56 | 0 | 60 | 4 | 0 | computing unit 1 |
| 17 | 1 | 63 | 0 | 60 | 4 | 0 | 1 | 1 | 0 | 2 | 1 | 0 | 1 | 63 | 0 | 60 | 4 | 0 | computing unit 2 |
| 18 | 0 | 63 | 1 | 70 | 0 | 0 | 0 | 1 | 0 | 2 | 1 | 0 | 0 | 63 | 1 | 80 | 3 | 0 | computing unit 1 |
| 19 | 1 | 70 | 0 | 70 | 0 | 1 | 1 | 2 | 0 | 2 | 0 | 1 | 1 | 70 | 0 | 80 | 3 | 0 | computing unit 3 |
| 20 | 0 | 0 | 1 | 10 | 3 | 0 | 0 | 0 | 1 | 2 | 2 | 0 | 0 | 70 | 0 | 80 | 3 | 0 | computing unit 1 |
| 21 | 1 | 7 | 0 | 10 | 3 | 0 | 1 | 1 | 0 | 2 | 1 | 0 | 1 | 77 | 0 | 80 | 3 | 0 | computing unit 2 |

TABLE 1-continued

| processing clock | M1 accumulation | Sm1 | N1 accumulation | Sn1 | Mod7 phase difference 1 | Reset | M2 accumulation | Sm2 | N2 accumulation | Sn2 | Mod7 phase difference 2 | Reset | M3 accumulation | Sm3 | N3 accumulation | Sn3 | Mod7 phase difference 3 | Reset | output computation |
|---|---|---|---|---|---|---|---|---|---|---|---|---|---|---|---|---|---|---|---|
| 22 | 0 | 7 | 0 | 10 | 3 | 0 | 0 | 1 | 0 | 2 | 1 | 0 | 0 | 77 | 0 | 80 | 3 | 0 | — |
| 23 | 1 | 14 | 0 | 10 | 3 | 0 | 1 | 2 | 0 | 2 | 0 | 1 | 1 | 84 | 0 | 80 | 3 | 0 | — |
| 24 | 0 | 14 | 1 | 20 | 6 | 0 | 0 | 0 | 1 | 2 | 2 | 0 | 0 | 84 | 1 | 100 | 2 | 0 | computing unit 1 |
| 25 | 1 | 21 | 0 | 20 | 6 | 0 | 1 | 1 | 0 | 2 | 1 | 0 | 1 | 91 | 0 | 100 | 2 | 0 | computing unit 2 |
| 26 | 0 | 21 | 1 | 30 | 2 | 0 | 0 | 1 | 0 | 2 | 1 | 0 | 0 | 91 | 0 | 100 | 2 | 0 | computing unit 1 |
| 27 | 1 | 28 | 0 | 30 | 2 | 0 | 1 | 2 | 0 | 2 | 0 | 1 | 1 | 98 | 0 | 100 | 2 | 0 | computing unit 3 |
| 28 | 0 | 28 | 0 | 30 | 2 | 0 | 0 | 0 | 1 | 2 | 2 | 0 | 0 | 98 | 0 | 100 | 2 | 0 | computing unit 2 |

The input cycles M1 to M3 are accumulated not in every processing clock period but once in every two clock periods. For example, assume the case where the sampling rate of input digital signals is 74 MHz (frequency of interlace HD video signals). In this case, if the input cycle M is accumulated once in every two clock periods, the frequency of the processing clock is substantially set to 74 MHz×2=148 MHz. The sampling rates of three output digital signals are about F1=52 MHz, F2=37 MHz, and F3=26 MHz, respectively. In order to process all of these signals, the processing clock needs to be F0 MHz, wherein F0≥F1+F2+F3=115 MHz. If the processing clock is 148 MHz, which is twice the clock rate of the input digital signals, the processing condition is satisfied since 148 MHz>115 MHz.

Table 2 illustrates operating states of the control unit.

TABLE 2

| state number | 0 | 1 | 2 | 3 | 4 | 5 | 6 | 7 |
|---|---|---|---|---|---|---|---|---|
| computation indication signal 1 | 0 | 1 | 0 | 1 | 0 | 1 | 0 | 1 |
| computation indication signal 2 | 0 | 0 | 1 | 1 | 0 | 0 | 1 | 1 |
| computation indication signal 3 | 0 | 0 | 0 | 0 | 1 | 1 | 1 | 1 |
| clear signal 1 | 0 | 1 | 0 | 1 | 0 | 1 | 0 | 1 |
| clear signal 2 | 0 | 0 | 1 | 0 | 0 | 0 | 1 | 0 |
| clear signal 3 | 0 | 0 | 0 | 0 | 1 | 0 | 0 | 0 |
| IN1 input | 0 | IN1 | 0 | IN1 | 0 | IN1 | 0 | IN1 |
| IN2 input | 0 | 0 | IN2 | IN2 | 0 | 0 | IN2 | IN2 |
| IN3 input | 0 | 0 | 0 | 0 | IN3 | IN3 | IN3 | IN3 |
| FIR-1 input | 0 | FIR-1 | 0 | FIR-1 | 0 | FIR-1 | 0 | FIR-1 |
| FIR-2 input | 0 | 0 | FIR-2 | FIR-2 | 0 | 0 | FIR-2 | FIR-2 |
| FIR-3 input | 0 | 0 | 0 | 0 | FIR-3 | FIR-3 | FIR-3 | FIR-3 |
| IN select output | 0 | IN1 | IN2 | IN1 | IN3 | IN1 | IN2 | IN1 |
| FIR coefficient output | 0 | FIR-1 | FIR-2 | FIR-1 | FIR-3 | FIR-1 | FIR-2 | FIR-1 |

When a plurality of computation indication signals are concurrently input, the priority of the group of input digital signals to be processed is in the order of IN1>IN2>IN3. A clear signal is output for the processed computation indication signal. For example, in the case of a state 3 (where computation indication signals 1 and 2 are asserted to 1), IN1 is selected and output, and a clear signal 1 is also output. Once IN1 is processed, and the computation indication signal 1 is cleared by the clear signal 1, the state shifts to a state 2 (where only the computation indication signal 2 is asserted to 1).

In the present embodiment, the position coordinate of an input digital signal adjacent to the position coordinate of an output digital signal is identified. Based on the identified position coordinate and the input sampling rate, the position coordinates of a fixed number of the input digital signals to be used in the FIR-LPF can be calculated. The FIR coefficients applied to these input digital signals are read from the memories, and FIR-LPF interpolating calculation is performed, so that output digital signals can be computed.

Since such processing is performed, the converter in the present embodiment is theoretically operative at an arbitrary clock frequency unrelated to the input/output sampling rates. Therefore, the converter is versatile since arbitrary input/output sampling rates (i.e., M and N are arbitrary) can be supported. Conventionally, the sampling rate that is the least common multiple of au input sampling rate and an output sampling rate is used. However, use of such a high sampling rate can be avoided in the present embodiment.

Although the conventional converter operates at three clock frequencies, the converter of the present embodiment can operate at one clock frequency. Accordingly, the sampling rate converter according to the present embodiment can be implemented by using an inexpensive semiconductor technology.

As a conventional technology, it has been proposed to mount a plurality of FIR calculation units in parallel to avoid use of a high sampling rate, though this proposal causes a problem of considerable increase in circuit size. Contrary to the conventional technology, the present embodiment does not need such a configuration, so that the circuit size can be reduced.

Moreover, in the present embodiment, when position coordinate differences respectively corresponding to two or more different output digital signals are concurrently computed, the control unit 11 supplies groups of FIR coefficients and groups of input digital signals corresponding to the respective position coordinate differences, to the parallel FIR calculator 4 in predetermined order. This enables parallel conversion to a plurality of sampling rates. Since the control unit 11 performs parallel serial conversion of the computation instructions from the plurality of position coordinate difference computing units 5a to 5c, the parallel FIR calculator 4 is operated in a time-division manner. This makes it possible to provide and share only one parallel FIR calculator very large in the circuit size, so that increase in the circuit size can be prevented and cost can be reduced.

In the present embodiment, the size relation between Smi and Sni is determined, and Mi is accumulated with Smi while Ni is accumulated with Sni so as to maintain the state where Smi and Sni are substantially matched for computing the positional relationship between the input and output digital signals. As a result, the position coordinate of an input digital signal adjacent to the position coordinate of an output digital signal can easily be identified.

Moreover, in the present embodiment, it is not necessary to set a common input cycle index M for a plurality of position coordinate difference computing units. That is, the input cycle indices M1 to Ma can take values relatively prime to respective output cycle indices N1 to Na. For example, when the sampling rate of input digital signals is expressed by Fin, and sampling rates of output digital signals are expressed by F1, F2, and F3, Fin:F1=10:7, Fin:F2=2:1, and Fin:F3=20:7 are formed. Based on this relation, C1=74M/10=7.4M, C2=74M/2=37M, C3=74M/20=3.7M are obtained. Precise output sampling rates in this case are F1=7.4M×7=51.8 MHz, F2=37M×1=37 MHz, and F3=3.7M×7=25.9 MHz.

Moreover, the input/output accumulators repeat the same operation in each cycle of the least common multiples between pairs of the respective input and output cycles. Accordingly, the position coordinate difference computing units 5a to 5c reset Smi and Sni to an initial value, whenever Smi and Sni become equal to the least common multiple of Mi and Ni. This makes it possible to reduce the number of bits that constitute the input/output accumulators. While the position coordinate difference computing units 5a to 5c share an input digital signal and a shift register, they can individually perform reset. In the above example, when the cyclic ratio is M1:N1=7:10, the least common multiple thereof is 70. When the cyclic ratio is M2:N2=1:2, the least common multiple thereof is 2. When the cyclic ratio is M3:N3=7:20, the least common multiple thereof is 140. After an initial reset to the coordinate 0, each of three types of cycle integers individually reset accumulated values whenever the values reach their least common multiples. By this reset, the positional relationship between the input and output digital signals is made to return to the positional relationship at the time of the initial reset (in which the position coordinates of the input and output signals are matched). The reset may be performed when a difference between Smi and Sni becomes equal to the initial value.

The shift register samples input digital signals in synchronization with an input clock, and the position coordinate difference computing units 5a to 5c compute in synchronizing with the input clock. The input clock is generated by dividing the processing clock. This is because computing a plurality of output digital signals by one FIR calculator needs to set $F0 \geq F1+F2+Fa$ wherein $F0$ represents a processing clock rate, and $F1, F2, \ldots Fa$ represent output sampling rates of a plurality of output digital signals, respectively. When a sampling rate of input digital signals of high definition (HD) videos is about 74 MHz, F1 is about 52 MHz, F2 is 37 MHz, and F3 is 26 MHz. To satisfy the above condition, $F0 \geq (52+37+26)=115$ MHz. Therefore, the condition is satisfied if the processing clock frequency is 74×2=148 MHz. In this case, the input digital signals are input once in every two cycles of the processing clock.

Second Embodiment

Figure 5:
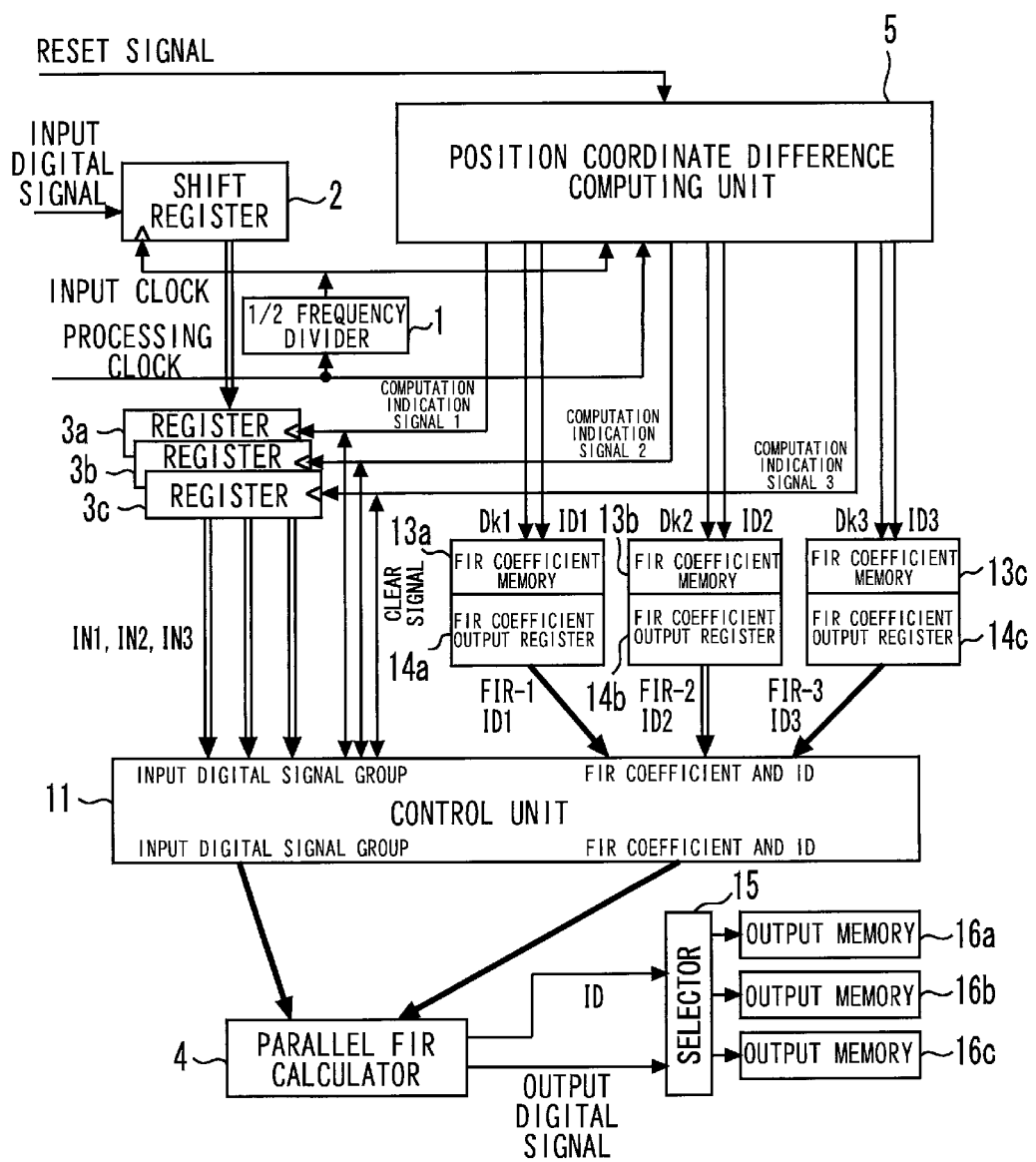
FIG. 5 is a block diagram illustrating a sampling rate converter according to a second embodiment of the present invention.
Figure 6:
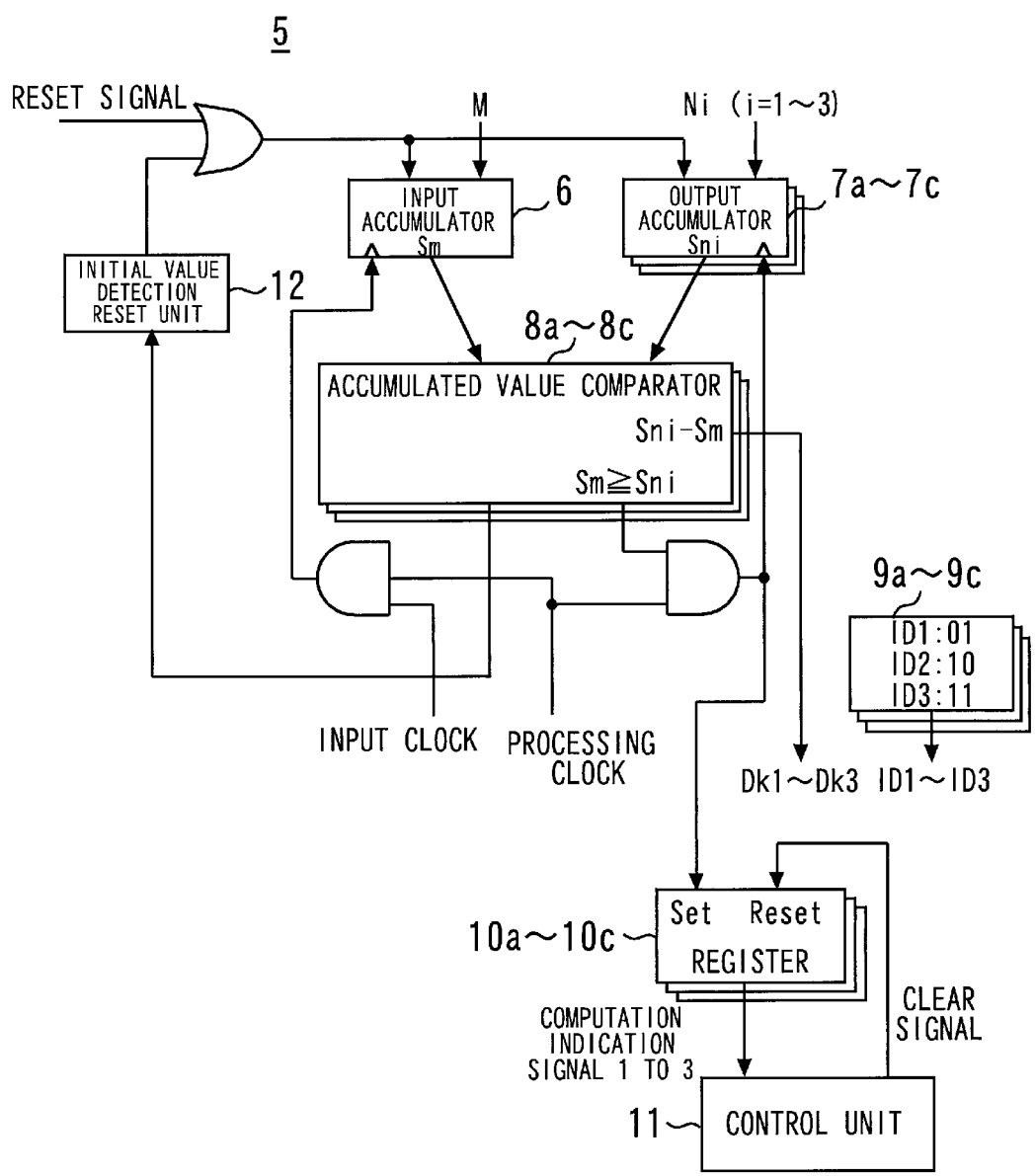
FIG. 6 is a block diagram illustrating a position coordinate difference calculation unit according to the second embodiment of the present invention.

FIG. 5 is a block diagram illustrating a sampling rate converter according to a second embodiment of the present invention. FIG. 6 is a block diagram illustrating a position coordinate difference calculation unit according to the second embodiment of the present invention. The second embodiment is different from the first embodiment in that one input accumulator is shared in the calculation of a plurality of output digital signals.

A position coordinate difference computing unit 5 has one input accumulator 6, three output accumulators 7a to 7c, three accumulated value comparators 8a to 8c that control the accumulators, and three ID generation units 9a to 9c.

When C1 represents a constant, and M and Ni (i=1, 2, 3) are relatively prime positive integers, sampling periods of input digital signals are set to Ci·M, and sampling periods of a plurality of output digital signals are set to Ci·Ni. The input accumulator 6 accumulates M in synchronization with an input clock, and outputs an accumulated value Sm. The output accumulators 7a to 7c accumulate Ni, and output accumulated values Sni, respectively. If Sm≤Sn1, the accumulated value comparators 8a to 8c make the input accumulator 6 accumulate M. If Sni≤Sm, the accumulated value comparators 8a to Sc make the output accumulator 7 accumulate Ni, and output Sni−Sm as a position coordinate difference Did obtained when the output accumulator 7 is made to accumulate Ni. At this point, the ID generation unit 9 outputs an IDi. If Sni≤Sm, the accumulated value comparators 8a to 8c output computation indication signals 1 to 3, which are each maintained and stored in registers 10a to 10c and are sent to a control unit 11 and registers 3a to 3c. Other configuration details are similar to those in the first embodiment.

A ratio of conversion from an input sampling rate to an output sampling rate by the position coordinate difference computing unit 5 is set to 14/20, 10/20, and 7/20 which are rational ratios close to $1/\sqrt{2}$, 1/2, and $1/2\sqrt{2}$. A ratio between input and output cycles are set to M=7, N1=10, N2=14, and N3=20 which are relatively prime positive integers so as to be close to $\sqrt{2}$, 2, and $2\sqrt{2}$. Table 3 indicates transition of the accumulated values in this case.

TABLE 3

| clock | M accumu- lation | Sm | N1 accumu- lation | Sn1 | Mod7 phase difference 1 | N2 accumu- lation | Sn2 | Mod7 phase difference 2 | N3 accumu- lation | Sn3 | Mod7 phase difference 3 | output computation |
|---|---|---|---|---|---|---|---|---|---|---|---|---|
|  |  | 0 |  | 0 |  |  | 0 |  |  | 0 |  |  |
| 1 | 1 | 7 | 1 | 10 | 3 | 1 | 14 | 0 | 1 | 20 | 6 | computing unit 1 |
| 2 | 0 | 7 | 0 | 10 | 3 | 0 | 14 | 0 | 0 | 20 | 6 | computing unit 2 |

TABLE 3-continued

| clock | M accumu-lation | Sm | N1 accumu-lation | Sn1 | Mod7 phase difference 1 | N2 accumu-lation | Sn2 | Mod7 phase difference 2 | N3 accumu-lation | Sn3 | Mod7 phase difference 3 | output computation |
|---|---|---|---|---|---|---|---|---|---|---|---|---|
| 3 | 1 | 14 | 0 | 10 | 3 | 0 | 14 | 0 | 0 | 20 | 6 | computing unit 3 |
| 4 | 0 | 14 | 1 | 20 | 6 | 1 | 28 | 0 | 0 | 20 | 6 | computing unit 1 |
| 5 | 1 | 21 | 0 | 20 | 6 | 0 | 28 | 0 | 0 | 20 | 6 | computing unit 2 |
| 6 | 0 | 21 | 1 | 30 | 2 | 0 | 28 | 0 | 1 | 40 | 5 | computing unit 1 |
| 7 | 1 | 28 | 0 | 30 | 2 | 0 | 28 | 0 | 0 | 40 | 5 | computing unit 3 |
| 8 | 0 | 28 | 0 | 30 | 2 | 1 | 42 | 0 | 0 | 40 | 5 | computing unit 2 |
| 9 | 1 | 35 | 0 | 30 | 2 | 0 | 42 | 0 | 0 | 40 | 5 | |
| 10 | 0 | 35 | 1 | 40 | 5 | 0 | 42 | 0 | 0 | 40 | 5 | computing unit 1 |
| 11 | 1 | 42 | 0 | 40 | 5 | 0 | 42 | 0 | 0 | 40 | 5 | |
| 12 | 0 | 42 | 1 | 50 | 1 | 1 | 56 | 0 | 1 | 60 | 4 | computing unit 1 |
| 13 | 1 | 49 | 0 | 50 | 1 | 0 | 56 | 0 | 0 | 60 | 4 | computing unit 2 |
| 14 | 0 | 49 | 0 | 50 | 1 | 0 | 56 | 0 | 0 | 60 | 4 | computing unit 3 |
| 15 | 1 | 56 | 0 | 50 | 1 | 0 | 56 | 0 | 0 | 60 | 4 | |
| 16 | 0 | 56 | 1 | 60 | 4 | 1 | 70 | 0 | 0 | 60 | 4 | computing unit 1 |
| 17 | 1 | 63 | 0 | 60 | 4 | 0 | 70 | 0 | 0 | 60 | 4 | computing unit 2 |
| 18 | 0 | 63 | 1 | 70 | 0 | 0 | 70 | 0 | 1 | 80 | 3 | computing unit 1 |
| 19 | 1 | 70 | 0 | 70 | 0 | 0 | 70 | 0 | 0 | 80 | 3 | computing unit 3 |
| 20 | 0 | 70 | 1 | 80 | 3 | 1 | 84 | 0 | 0 | 80 | 3 | computing unit 1 |
| 21 | 1 | 77 | 0 | 80 | 3 | 0 | 84 | 0 | 0 | 80 | 3 | computing unit 2 |
| 22 | 0 | 77 | 0 | 80 | 3 | 0 | 84 | 0 | 0 | 80 | 3 | |
| 23 | 1 | 84 | 0 | 80 | 3 | 0 | 84 | 0 | 0 | 80 | 3 | |
| 24 | 0 | 84 | 1 | 90 | 6 | 1 | 98 | 0 | 1 | 100 | 2 | computing unit 1 |
| 25 | 1 | 91 | 0 | 90 | 6 | 0 | 98 | 0 | 0 | 100 | 2 | computing unit 2 |
| 26 | 0 | 91 | 1 | 100 | 2 | 0 | 98 | 0 | 0 | 100 | 2 | computing unit 3 |
| 27 | 1 | 98 | 0 | 100 | 2 | 0 | 98 | 0 | 0 | 00 | 2 | computing unit 1 |
| 28 | 0 | 98 | 0 | 100 | 2 | 1 | 112 | 0 | 0 | 00 | 2 | computing unit 2 |
| 29 | 1 | 105 | 0 | 100 | 2 | 0 | 112 | 0 | 0 | 100 | 2 | |
| 30 | 0 | 105 | 1 | 110 | 5 | 0 | 112 | 0 | 1 | 120 | 1 | computing unit 1 |

In the present embodiment wherein only one input accumulator is used, the accumulated values show the same transition as in the first embodiment. Therefore, the circuit size can further be reduced while the same effect as in the first embodiment is achieved.

Third Embodiment

Figure 7:
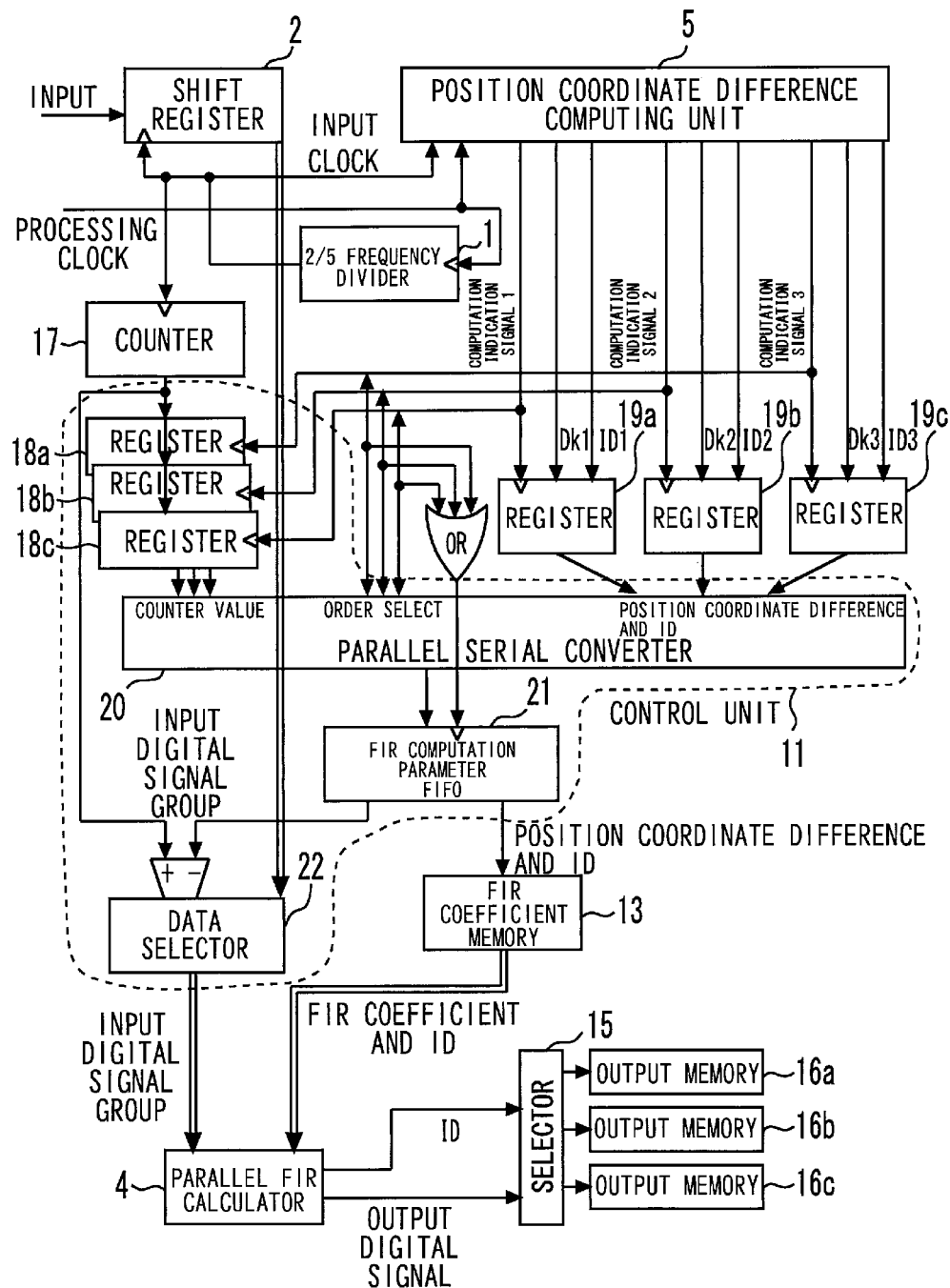
FIG. 7 is a block diagram illustrating a sampling rate converter according to a third embodiment of the present invention.

FIG. 7 is a block diagram illustrating a sampling rate converter according to a third embodiment of the present invention. In the present invention, a count value of a counter 17 is stored in registers 18a to 18c instead of directly storing groups of input digital signals in the registers as in the first and second embodiments. The counter 17 counts in synchronization with a shift register 2. This count value indicates the operating state of the shift register 2.

The FIR coefficients are also not directly stored in the registers, but IDs (2 bits) and phase differences Dki respectively corresponding to three output digital signals are stored in registers 19a to 19c.

When position coordinate differences respectively corresponding to two or more different output digital signals are concurrently computed, a parallel serial converter 20 in the control unit 11 stores each of the position coordinate differences and a first count value, which is a value of the counter 17 at the time when each of the position coordinate differences is computed, in an FIR computation parameter FIFO 21 in a predetermined order.

Based on a difference between a second count value which is a current value of the counter 17 and the first count value stored in the registers 18a to 18c, a data selector 22 reads out a group of input signals corresponding to the first count value from the shift register 2 and supplies it to the parallel FIR calculator 4. For example, when a count value 150 is stored in the registers 18a to 18c and the count value at the time of computation is 152, a past input digital signal group which is two samples before (152−150=2) is selected from the shift register 2. Based on the ID and the phase difference, an appropriate FIR coefficient is read out from an FIR coefficient memory 13.

At the time of computing the output digital signals concurrently generated in parallel, the type of FIR (output digital signals to be computed) is determined based on the ID code included in FIR computation parameters (constituted of the ID code and the position coordinate difference). With reference to the position coordinate differences (respective values of Sn1−Sm, Sn2−Sm, and Sn3−Sm expressed by Modulo (M)), a coefficient group to use is determined based on the position difference (phase) in the FIR coefficients.

Table 4 illustrates transition of the accumulated values in the present embodiment. The sampling rate of input digital signals is 74 MHz. The sampling rates of three output digital signals are converted in the step of about $1/\sqrt{2}$ (7/10 in actuality). The sampling rates F1, F2, and F3 of the three output digital signals are 52 MHz, 37 MHz, and 26 MHz, respectively. In this case, since F1+F2+F3=115 MHz, the processing clock F0 is set to F0=Fin×5/3≈123 MHz (>115 MHz).

TABLE 4

| clock | M accumulation | Sm | N1 accumulation | Sn1 | Mod7 phase difference 1 | N2 accumulation | Sn2 | Mod7 phase difference 2 | N3 accumulation | Sn3 | Mod7 phase difference 3 | output computation |
|---|---|---|---|---|---|---|---|---|---|---|---|---|
|  |  | 0 |  | 0 |  |  | 0 |  |  | 0 |  |  |
| 1 | 1 | 7 | 1 | 10 | 3 | 1 | 14 | 0 | 1 | 20 | 6 | computing unit 1 |
| 2 | 0 | 7 | 0 | 10 | 3 | 0 | 14 | 0 | 0 | 20 | 6 | computing unit 2 |
| 3 | 1 | 14 | 0 | 10 | 3 | 0 | 14 | 0 | 0 | 20 | 6 | computing unit 3 |
| 4 | 0 | 14 | 1 | 20 | 6 | 1 | 28 | 0 | 0 | 20 | 6 |  |
| 5 | 1 | 21 | 0 | 20 | 6 | 0 | 28 | 0 | 0 | 20 | 6 | computing unit 2 |
| 6 | 1 | 28 | 1 | 30 | 2 | 0 | 28 | 0 | 1 | 40 | 5 | computing unit 1 |
| 7 | 0 | 28 | 0 | 30 | 2 | 0 | 42 | 0 | 0 | 40 | 5 | computing unit 3 |
| 8 | 1 | 35 | 0 | 30 | 2 | 1 | 42 | 0 | 0 | 40 | 5 | computing unit 2 |
| 9 | 0 | 35 | 1 | 40 | 5 | 0 | 42 | 0 | 0 | 40 | 5 | computing unit 1 |
| 10 | 1 | 42 | 0 | 40 | 5 | 0 | 42 | 0 | 0 | 40 | 5 |  |
| 11 | 1 | 49 | 1 | 50 | 1 | 1 | 56 | 0 | 1 | 60 | 4 | computing unit 1 |
| 12 | 0 | 49 | 0 | 50 | 1 | 0 | 56 | 0 | 0 | 60 | 4 | computing unit 2 |
| 13 | 1 | 56 | 0 | 50 | 1 | 0 | 56 | 0 | 0 | 60 | 4 | computing unit 3 |
| 14 | 0 | 56 | 1 | 60 | 4 | 1 | 70 | 0 | 0 | 60 | 4 | computing unit 1 |
| 15 | 1 | 63 | 0 | 60 | 4 | 0 | 70 | 0 | 0 | 60 | 4 | computing unit 2 |
| 16 | 1 | 70 | 1 | 70 | 0 | 0 | 70 | 0 | 1 | 80 | 3 | computing unit 1 |
| 17 | 0 | 70 | 1 | 80 | 3 | 1 | 84 | 0 | 0 | 80 | 3 | computing unit 3 |
| 18 | 1 | 77 | 0 | 80 | 3 | 0 | 84 | 0 | 0 | 80 | 3 | computing unit 1 |
| 19 | 0 | 77 | 0 | 80 | 3 | 0 | 84 | 0 | 0 | 80 | 3 | computing unit 2 |
| 20 | 1 | 84 | 0 | 80 | 3 | 0 | 84 | 0 | 0 | 80 | 3 |  |
| 21 | 1 | 91 | 1 | 90 | 6 | 1 | 98 | 0 | 1 | 100 | 2 | computing unit 1 |
| 22 | 0 | 91 | 1 | 100 | 2 | 0 | 98 | 0 | 0 | 100 | 2 | computing unit 2 |
| 23 | 1 | 98 | 0 | 100 | 2 | 0 | 98 | 0 | 0 | 100 | 2 | computing unit 3 |
| 24 | 0 | 98 | 0 | 100 | 2 | 1 | 112 | 0 | 0 | 100 | 2 | computing unit 1 |
| 25 | 1 | 105 | 0 | 100 | 2 | 0 | 112 | 0 | 0 | 100 | 2 | computing unit 2 |
| 26 | 1 | 112 | 1 | 110 | 5 | 0 | 12 | 0 | 1 | 120 | 1 | computing unit 1 |
| 27 | 0 | 112 | 1 | 120 | 1 | 1 | 26 | 0 | 0 | 120 | 1 | computing unit 3 |
| 28 | 1 | 119 | 0 | 120 | 1 | 0 | 126 | 0 | 0 | 120 | 1 | computing unit 1 |
| 29 | 0 | 119 | 0 | 120 | 1 | 0 | 126 | 0 | 0 | 120 | 1 | computing unit 2 |
| 30 | 1 | 126 | 0 | 120 | 1 | 0 | 126 | 0 | 0 | 120 | 1 |  |

As compared with transition of the accumulated values in Table 3, the sampling rates of the input/output digital signals are identical but the frequency of the processing clock is reduced from 148 MHz to 123 MHz. This indicates that the cycle in which an output digital signal is not computed is decreased.

The effect of the present embodiment is described in comparison with the first and second embodiments. In the first and second embodiments, the capacity of the registers 3a to 3c and the FIR coefficient memories 13a to 13c is considerably large. For example, in the first embodiment, the capacity of 900 bits is necessary for storing the input digital signals as Pix bit×p×a=10×30×3=900, wherein Pix bit represents the number of pixel bits, p represents the number of adjacent input digital signals for use in calculation of an output digital signal, and a represents the number of signals in parallel. In the present embodiment, when the number of pixels is 1920 in horizontal conversion of an HD frame, the count value takes only 11 bits. Accordingly, the capacity of the registers 18a to 18c is only 11×3=33 bits. Therefore, the capacity can be reduced to about 1/27.

As for the FIR coefficient register, total 1086 bits are necessary in the first embodiment as the FIR coefficient having the accuracy of 12 bits takes 12×p×a=12×30×3=1080 bit, and the identification ID of 2 bits takes 2×3=6 bit. In the present embodiment, the necessary capacity is only 28 bits which is constituted of: the product of M and a=7×3=21 bits, wherein M represents the number of types of position difference and a represents the number of signals in parallel; and the identification ID of 6 bits. Therefore, the present embodiment can substantially reduce the memory capacity.

However, in order to store past input digital signals so as to prevent the input digital signals from shifting out from the shift register 2 during computation, it is necessary to expand the number of the shift registers 2 by the number of the signals in parallel. For example, when the number of signals in parallel is three, the shift register 2 is extended by three samples. In general terms, when the number of signals in parallel is "a", FIR calculation may be delayed for "a" clock periods. Accordingly, the shift register 2 is set to have a capacity of p+a input digital signals. If three signals come in parallel, the shift register may be expanded by three samples. Although the capacity of the shift register 2 is 300 bits for thirty pixels in the first embodiment, the capacity is increased to 330 bits for thirty three pixels in the present embodiment.

For example, when the number of signals in parallel is eight in HD horizontal sampling rate conversion, the configuration similar to the present embodiment is applied. Assume that in nine irreducible integer pairs of M and N1 to N8, M can be expressed with 6 bits, and 30-tap FIR coefficients of 12-bit accuracy are used. In this assumption, for each pair, the shift counter that stores the value up to 1920 takes 11 bits, the position difference data takes 6 bits, and ID data takes 3 bits, which results in total 20 bits. The memory capacity to store eight pairs of these 20-bit data amounts to 20 bits×8=160 bits. If the first embodiment is applied without any modification, the shift register takes 10×30×8=2400 bits, the FIR coefficient output register takes 12×30×8+3×8=2880+24=2904 bits. Therefore, the present embodiment can more substantially reduce the memory capacity.

Fourth Embodiment

Figure 8:
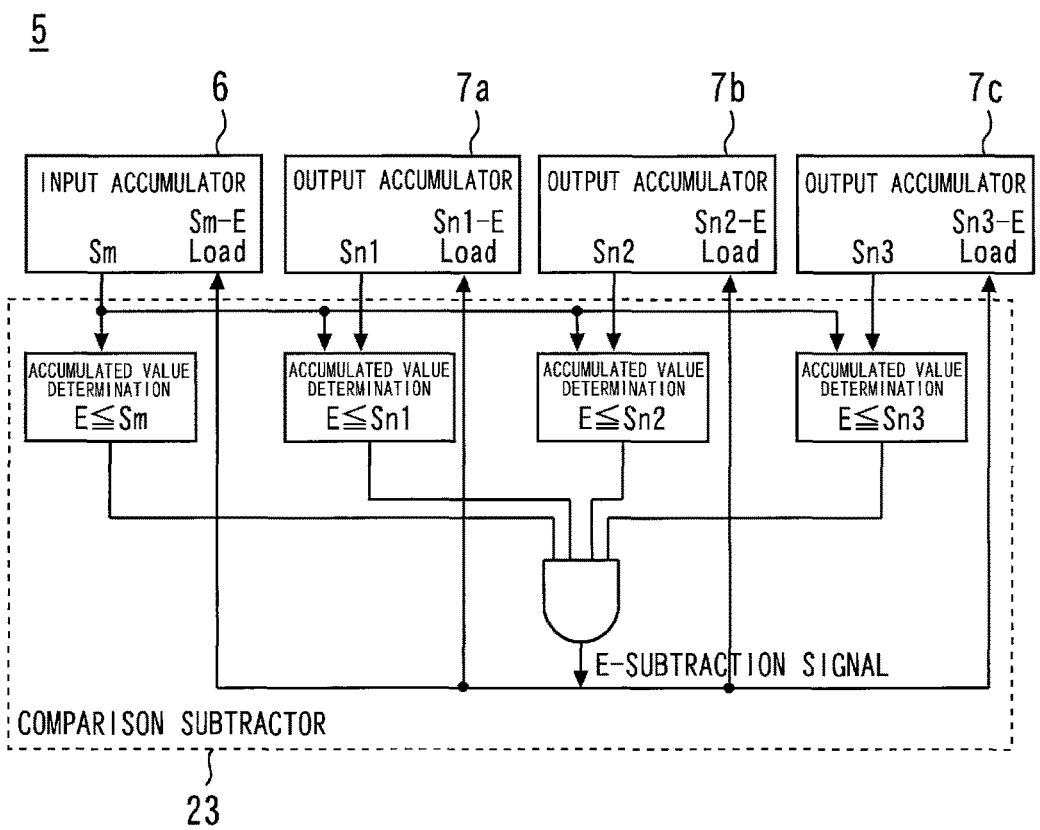
FIG. 8 is a block diagram illustrating a position coordinate difference computation unit according to a fourth embodiment of the present invention.

FIG. 8 is a block diagram illustrating a position coordinate difference computation unit according to a fourth embodiment of the present invention. The position coordinate difference computing unit 5 further has a comparison subtractor 23 in addition to the configuration of the second embodiment (not illustrated). In the comparison subtractor 23, E is set to be a positive integer not less than M, or not less than N1 to N3. When Sm and all the Sn1 to Sn3 are not less than E, the comparison subtractor 23 concurrently supplies a Load clock to the input accumulator 6 and the output accumulator 7, and concurrently subtracts E from Sm and Sn1 to Sn3.

Table 5 illustrates transition of the accumulated values Sm and Sn1 to Sn3 in the present embodiment. The sampling rate of input digital signals is 74 MHz (123.3 MHz×3/5=74 MHz wherein 123.3 MHz is valid in three clock periods in five clock cycles). The frequency of the processing clock is 123.3 MHz, and the sampling rates of output digital signals are 52 MHz, 37 MHz, and 26 MHz.

TABLE 5

| clock | M accumulation | Sm | N1 accumulation | Sn1 | Mod7 phase difference 1 | N2 accumulation | Sn2 | Mod7 phase difference 2 | N3 accumulation | Sn3 | Mod7 phase difference 3 | E-subtraction signal | output computation |
|---|---|---|---|---|---|---|---|---|---|---|---|---|---|
|  |  | 0 |  | 0 |  |  | 0 |  |  | 0 |  |  |  |
| 1 | 1 | 7 | 1 | 10 | 3 | 1 | 14 | 0 | 1 | 20 | 6 | 0 | computing unit 1 |
| 2 | 0 | 7 | 0 | 10 | 3 | 0 | 14 | 0 | 0 | 20 | 6 | 0 | computing unit 2 |
| 3 | 1 | 14 | 0 | 10 | 3 | 0 | 14 | 0 | 0 | 20 | 6 | 0 | computing unit 3 |
| 4 | 0 | 14 | 1 | 20 | 6 | 1 | 28 | 0 | 0 | 20 | 6 | 0 | computing unit 1 |
| 5 | 1 | 21 | 0 | 20 | 6 | 0 | 28 | 0 | 0 | 20 | 6 | 0 | computing unit 2 |
| 6 | 1 | 28 | 1 | 30 | 2 | 0 | 28 | 0 | 1 | 40 | 5 | 0 | computing unit 1 |
| 7 | 0 | 28 | 0 | 30 | 2 | 1 | 42 | 0 | 0 | 40 | 5 | 0 | computing unit 3 |
| 8 | 1 | 35 | 0 | 30 | 2 | 0 | 42 | 0 | 0 | 40 | 5 | 0 | computing unit 2 |
| 9 | 0 | 35 | 1 | 40 | 5 | 0 | 42 | 0 | 0 | 40 | 5 | 1 | computing unit 1 |
| 10 | 1 | 10 | 0 | 8 | 5 | 0 | 10 | 0 | 0 | 8 | 5 | 0 |  |
| 11 | 1 | 17 | 1 | 18 | 1 | 1 | 24 | 0 | 1 | 28 | 4 | 0 | computing unit 1 |
| 12 | 0 | 17 | 0 | 18 | 1 | 0 | 24 | 0 | 0 | 28 | 4 | 0 | computing unit 2 |

TABLE 5-continued

| clock | M accumu- lation | Sm | N1 accumu- lation | Sn1 | Mod7 phase difference 1 | N2 accumu- lation | Sn2 | Mod7 phase difference 2 | N3 accumu- lation | Sn3 | Mod7 phase difference 3 | E- sub- traction signal | output computation |
|---|---|---|---|---|---|---|---|---|---|---|---|---|---|
| 13 | 1 | 24 | 0 | 18 | 1 | 0 | 24 | 0 | 0 | 28 | 4 | 0 | computing unit 3 |
| 14 | 0 | 24 | 1 | 28 | 4 | 1 | 38 | 0 | 0 | 28 | 4 | 0 | computing unit 1 |
| 15 | 1 | 31 | 0 | 28 | 4 | 0 | 38 | 0 | 0 | 28 | 4 | 0 | computing unit 2 |
| 16 | 1 | 38 | 1 | 38 | 0 | 0 | 38 | 0 | 1 | 48 | 3 | 1 | computing unit 1 |
| 17 | 0 | 8 | 1 | 16 | 3 | 1 | 20 | 0 | 0 | 16 | 3 | 0 | computing unit 3 |
| 18 | 1 | 3 | 0 | 16 | 3 | 0 | 20 | 0 | 0 | 16 | 3 | 0 | computing unit 1 |
| 19 | 0 | 3 | 0 | 16 | 3 | 0 | 20 | 0 | 0 | 16 | 3 | 0 | computing unit 2 |
| 20 | 1 | 20 | 0 | 16 | 3 | 0 | 20 | 0 | 0 | 16 | 3 | 0 | |
| 21 | 1 | 27 | 1 | 26 | 6 | 1 | 34 | 0 | 1 | 36 | 2 | 0 | computing unit 1 |
| 22 | 0 | 27 | 1 | 36 | 2 | 0 | 34 | 0 | 0 | 36 | 2 | 0 | computing unit 2 |
| 23 | 1 | 34 | 0 | 36 | 2 | 0 | 34 | 0 | 0 | 36 | 2 | 1 | computing unit 3 |
| 24 | 0 | 2 | 0 | 4 | 2 | 1 | 16 | 0 | 0 | 4 | 2 | 0 | computing unit 1 |
| 25 | 1 | 9 | 0 | 4 | 2 | 0 | 16 | 0 | 0 | 4 | 2 | 0 | computing unit 2 |
| 26 | 1 | 16 | 1 | 14 | 5 | 0 | 16 | 0 | 1 | 24 | 1 | 0 | computing unit 1 |
| 27 | 0 | 16 | 1 | 24 | 1 | 1 | 30 | 0 | 0 | 24 | 1 | 0 | computing unit 3 |
| 28 | 1 | 23 | 0 | 24 | 1 | 0 | 30 | 0 | 0 | 24 | 1 | 0 | computing unit 1 |
| 29 | 0 | 23 | 0 | 24 | 1 | 0 | 30 | 0 | 0 | 24 | 1 | 0 | computing unit 2 |
| 30 | 1 | 30 | 0 | 24 | 1 | 0 | 30 | 0 | 0 | 24 | 1 | 0 | |

Although the input/output operation is the same as in Table 3, a column of E-subtraction signal is added. When an E-subtraction signal is 1, E=32 is concurrently subtracted from the respective accumulated values in the next processing clock period. This subtraction and cyclic integration are concurrently executed, and therefore in transition of Sm during the clock numbers 9 to 10 for example, 32 is subtract from 35 and then 7 is accumulated. As a result, an accumulated value of 35−32+7=10 is obtained.

When M=7 is set in HD videos, the accumulated value Sm is set to 1920×7=13440 at the maximum in the second embodiment. In order to perform integration and control to obtain this maximum value, the input/output accumulators and their control portion need to be constituted of 14 bits. Accordingly, in the present embodiment, when Sm and all the Sn1 to Sn3 are not less than E, E is concurrently subtracted from Sm and from Sn1 to Sn3. This makes it possible to construct the input/output accumulators and their control portion by using roughly the number of bits that expresses E+1 bits.

For example, assume the case of M=7, N1 to N3=10, 14, 20, and E=25. In this case, since E can be expressed with 5 bits, the configuration of the respective accumulators and their control portion can be made of 6 bits. Furthermore, if E=32, comparison between the respective accumulated values and E can be achieved by determining whether the sixth bit is 1 or 0. Subtraction of E can also be achieved by changing 1 to 0 in the sixth bit. Therefore, the value of E is preferably set to a power of 2.

Since frames are spatially divided, an accumulated value is set to 0 at the first pixel of every horizontal pixel in the case of images. Accordingly, when M=7, a 14-bit circuitry is obtained. On the contrary, audio is not divided. In the case of converting, for example, the sampling rate of 48 kHz into the sampling rate of 44.1 kHz, a cyclic ratio is equal to 147:160. Accordingly, once sampling rate conversion is started, the data amounts to a 39.1st power of 48000×3600× 24×147≈2 in 24 hours. Therefore, a circuitry of 40-bit accuracy is needed as the input/output accumulators and their control portion.

In the second embodiment as in the first embodiment, the number of bits can also be reduced by resetting with a cycle of the least common multiple of M and Ni (i=1, 2, . . . , a). However, since the least common multiple between a+1 positive integers is a relatively large value, the present embodiment is more practical.

Figure 9:
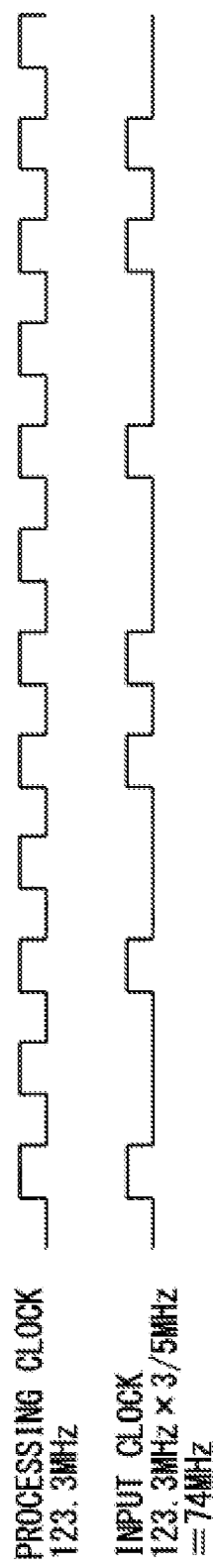
FIG. 9 illustrates generation of a 74 MHz input clock from a 123.3 MHz processing clock.
Figure 10:
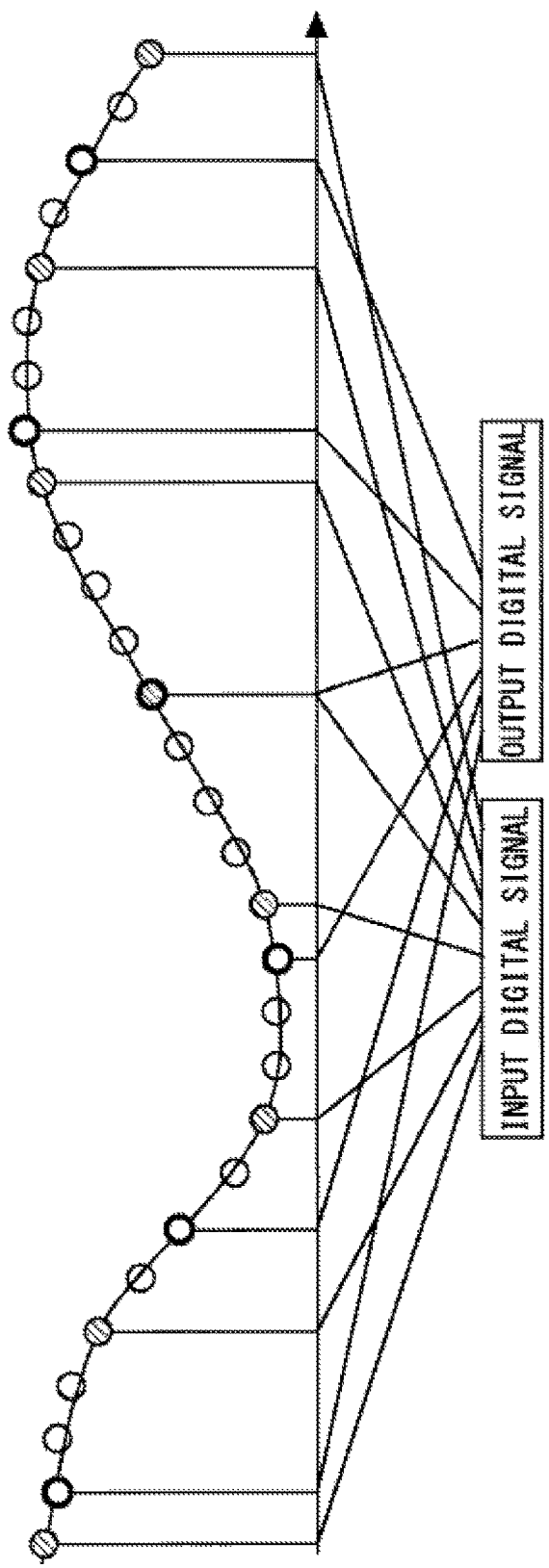
FIG. 10 is an explanatory view of a conventional method for converting sampling rates.
Figure 11:
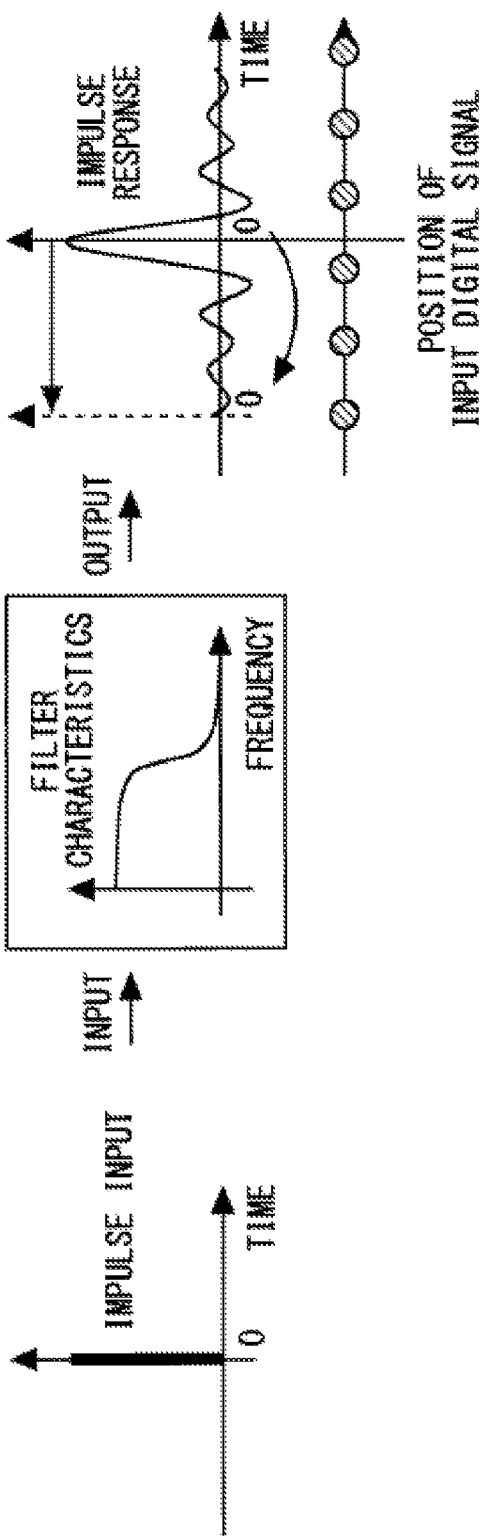
FIG. 11 illustrates an impulse response of the FIR-LPF.

FIG. 9 illustrates generation of a 74 MHz input clock from a 123.3 MHz processing clock. The input clock is not a uniform clock but is made by dividing the processing clock in units of five cycles and using three cycles out of the five cycles. This clock cycle configuration is also illustrated in "M integration" of Table 3. Thus, the processing clock is divided to generate an input clock having a frequency that is A1/A2 (A1 and A2 being positive integers) times the frequency of the processing clock. In this case, only during A2 cycles out of A1 cycles of the processing clock, the input digital signals are transferred to the shift register. Thus, the frequency of the input clock can be controlled, which makes it possible to implement the circuit that synchronously operates depending on mounting conditions.

DESCRIPTION OF SYMBOLS

1 frequency divider; 2 shift register; 4 parallel FIR calculator (FIR calculator); 5,5a,5b,5c position coordinate difference computing unit; 6 input accumulator; 7 output accumulator; 8 accumulated value comparator; 11 control unit; 13,13a,13b,13c FIR coefficient memory; 17 counter; 21 FIR computation parameter FIFO (memory); 22 data selector; 23 comparison subtractor

The invention claimed is:

1. A sampling rate converter converting input digital signals Xki sampled at an input sampling rate into a plurality of output digital signals Yki each sampled at output sampling rates different from each other, comprising:
   a position coordinate difference computing unit calculating position coordinate differences Dki between position coordinates Tki of the plurality of output digital signals Yki and position coordinates Zki of the input digital signals Xki adjacent to the position coordinates Tki;
   an FIR coefficient memory storing a plurality of FIR coefficients F(z), with z being a variable number about a position coordinate, of a finite impulse response low pass filter (FIR-LPF), and outputting the plurality of FIR coefficients F(z) corresponding to the position coordinate differences Dki, and outputting the plurality of FIR coefficients, where F(z) is represented as F(Tki−Zki (1)), . . . , F(Tki−Zki (p)) corresponding to a plurality of position coordinates z=Tki−Zki(1), . . . , Tki−Zki(p), respectively, when the position coordinate differences Dki are input, wherein the FIR-LPF has a characteristic of blocking frequency components which are ½ or more of the output sampling rate and the position coordinates Zki (1), . . . , Zki(p) represent position coordinates of a fixed number of the input digital signals Xki (1), . . . , Xki(p) present in the vicinity of a periphery of the position coordinates Tki of the output digital signals Yki;
   a common parallel FIR calculator calculating, in parallel, Yki=F(Tki−Zki(1))*Xki(1)+ . . . +F(Tki−Zki (p))*Xki (p) to obtain the plurality of output digital signals Yki, wherein the plurality of output digital signals Yki are temporarily stored, before being output in synchronization with an output clock, in a plurality of output memories selected by a selector based on a corresponding identification of the plurality of output digital signals Yki, and wherein the plurality of output digital signals Yki are output in parallel at different sampling rates;
   a control unit supplying a group of the FIR coefficients and a group of the input digital signals corresponding to the respective position coordinate differences to the common parallel FIR calculator in a predetermined order when the position coordinate differences corresponding to two or more different output digital signals are concurrently computed;
   a shift register storing the input digital signals sequentially; and
   a counter counting in synchronization with the shift register, wherein the control unit comprises:
      a parallel serial converter configured to store the position coordinate differences and a first count value indicating a value of the counter when each of the position coordinate differences is computed in an FIR computation parameter memory in the predetermined order when the position coordinate differences respectively corresponding to two or more different output digital signals are concurrently computed, and
      a data selector reading out a group of the input digital signals corresponding to the first count value from the shift register based on a difference between a second count value which is a current value of the counter and the first count value and supplying the group of the input digital signals to the parallel FIR calculator.

2. The sampling rate converter according to claim 1, wherein the control unit outputs the position coordinate difference and the first count value corresponding to the output digital signals stored in the memory to the FIR coefficient memory, and wherein he FIR coefficient memory supplies the FIR coefficients corresponding to the position coordinate difference and the first count value output from the control unit to the FIR calculator.

3. The sampling rate converter according to claim 1, wherein the plurality of output digital signals Yki provide for continuous service within a network when a change in network quality occurs.

* * * * *